US012694172B2

(12) United States Patent　　(10) Patent No.:　US 12,694,172 B2
Guo　　(45) Date of Patent:　Jul. 28, 2026

(54) METHOD TO PREDICT MACHINED PART VARIATION FOR DESIGN OPTIMIZATION

(71) Applicant: RTX Corporation, Farmington, CT (US)

(72) Inventor: Changsheng Guo, South Windsor, CT (US)

(73) Assignee: RTX CORPORATION, Farmington, CT (US)

(*) Notice: Subject to any disclaimer, the term of this patent is extended or adjusted under 35 U.S.C. 154(b) by 1070 days.

(21) Appl. No.: 17/849,231

(22) Filed: Jun. 24, 2022

(65) Prior Publication Data

US 2022/0414293 A1　Dec. 29, 2022

Related U.S. Application Data

(60) Provisional application No. 63/214,842, filed on Jun. 25, 2021.

(51) Int. Cl.
*G06F 30/20*　　(2020.01)
*G06F 30/17*　　(2020.01)

(52) U.S. Cl.
CPC .............. *G06F 30/20* (2020.01); *G06F 30/17* (2020.01)

(58) Field of Classification Search
CPC ................................. G06F 30/20; G06F 30/17
USPC ........................................................... 703/1
See application file for complete search history.

(56) References Cited

U.S. PATENT DOCUMENTS

| | | | |
|---|---|---|---|
| 5,691,909 | A | 11/1997 | Frey et al. |
| 10,401,823 | B2 | 9/2019 | Wang et al. |
| 10,884,392 | B2 | 1/2021 | Sanders et al. |
| 2019/0235473 | A1 | 8/2019 | Miyata et al. |
| 2021/0141968 | A1 | 5/2021 | Degostin et al. |

FOREIGN PATENT DOCUMENTS

EP　　　　　3176659 A1　　6/2017

OTHER PUBLICATIONS

Liu_2005 (Virtual Assembly and Tolerance Analysis for Collaborative Design, The 9th International Conference on Computer Supported Cooperative Work in Design Proceedings, 2005). (Year: 2005).*
Yao_2002 (VMMC: A test-bed for machining, Computers in Industry 47 (2002) 255-268) (Year: 2002).*
Stockinger_2010 (Virtual Assembly Analysis: Standard Tolerance Analysis Compared to Manufacturing Simulation and Relative Positioning, International Design Conference—Design 2010). (Year: 2010).*

(Continued)

*Primary Examiner* — Brian S Cook
(74) *Attorney, Agent, or Firm* — CANTOR COLBURN LLP

(57)　　　　　ABSTRACT

A method of predicting machined part variations for design optimization is provided. The method includes receiving computerized specifications for a part and tooling specifications for tooling used for building the part, producing the part using virtual machining based on the computerized and the tooling specifications and producing variations of the part using the virtual machining based on the computerized and the tooling specifications and based on variations of at least some of the tooling specifications.

15 Claims, 4 Drawing Sheets

(56) References Cited

OTHER PUBLICATIONS

Soori_2021 (Virtual Machining Systems for CNC Milling and Turning Machine Tools: A Review, International Journal of Engineering and Future Technology, 2021) (Year: 2021).*

Geng_2021 (Review of geometric error measurement and compensation techniques of ultra-precision machine tools, Light: Advanced Manufacturing (2021) published online: May 8, 2021). (Year: 2021).*

Soori_ISSN_Pub_Date (ISSN:2455-6432 Jun. 2, 2021 (Year: 2021).*

Jones et al., "A simulated-based production testbed" Proceedings of the Winter Simulation Conference, (Dec. 1997) pp. 1299-1306.

Search Report issued in European Application No. 22180933.8; Application Filing Date Jun. 24, 2022; Date of Mailing Nov. 16, 2022 (9 pages).

Yao et al., "VMMC: a test-bed for machining" Computers in Industry, vol. 47, No. 3, (Mar. 2002) pp. 255-268.

* cited by examiner

200

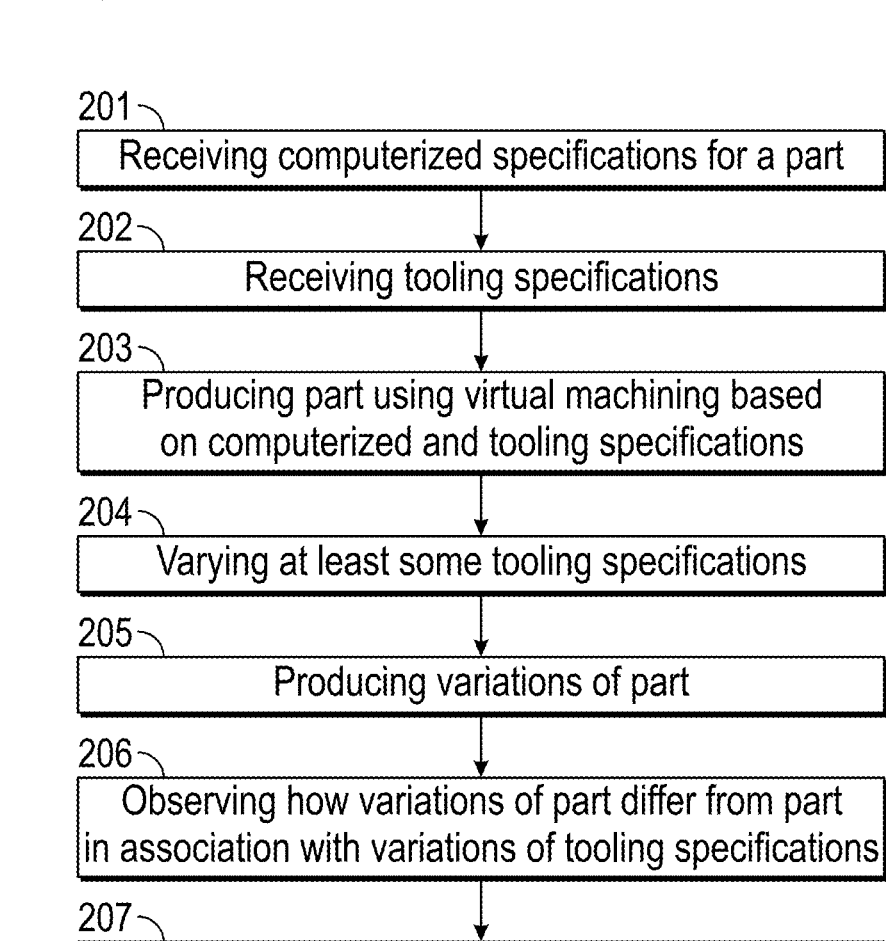

201

Receiving computerized specifications for a part

202

Receiving tooling specifications

203

Producing part using virtual machining based on computerized and tooling specifications

204

Varying at least some tooling specifications

205

Producing variations of part

206

Observing how variations of part differ from part in association with variations of tooling specifications

207

Predicting how tooling will react

FIG. 2

METHOD TO PREDICT MACHINED PART VARIATION FOR DESIGN OPTIMIZATION

CROSS-REFERENCE TO RELATED APPLICATIONS

This application claims priority to U.S. Provisional Application No. 63/214,842 filed Jun. 25, 2021, the contents of which are hereby incorporated by reference in its entirety.

BACKGROUND

The present disclosure relates to design optimization and, more particularly, to a method of predicting machined part variation for design optimization.

Design optimization often requires manufacturing variations of geometric features, such as fillet radius or airfoil thickness, to evaluate performance variations such as stresses. Currently, assumptions are often made based on the experiences and knowledge of the operators or the design engineers on the design team. This can, however, lead to designs with manufacturing challenges or additional costs, especially for new designs with features that have not been manufactured in the past.

Accordingly, an improved method to predict part variations using virtual machining is needed.

BRIEF DESCRIPTION

According to an aspect of the disclosure, a method of predicting machined part variations for design optimization is provided. The method includes receiving computerized specifications for a part and tooling specifications for tooling used for building the part, producing the part using virtual machining based on the computerized and the tooling specifications and producing variations of the part using the virtual machining based on the computerized and the tooling specifications and based on variations of at least some of the tooling specifications.

In accordance with additional or alternative embodiments, the computerized specifications include at least one of computer aided design (CAD) specifications and computer aided manufacturing (CAM) specifications.

In accordance with additional or alternative embodiments, the tooling specifications include models of machine tools, controllers, stock designs, cutters and tool paths.

In accordance with additional or alternative embodiments, tooling specifications further include machine capability information.

In accordance with additional or alternative embodiments, the machine capability information includes axis position accuracy information.

In accordance with additional or alternative embodiments, the machine capability information includes cutter accuracy information.

In accordance with additional or alternative embodiments, the variations of the tooling specifications include changes to axis position accuracy information and cutter accuracy information.

According to an aspect of the disclosure, a method of predicting machined part variations for design optimization is provided. The method includes receiving computerized specifications for a part and tooling specifications for tooling used for building the part, producing the part using virtual machining based on the computerized and the tooling specifications, varying at least some of the tooling specifications, producing variations of the part using the virtual machining based on the computerized and the tooling specifications and based on variations of the at least some of the tooling specifications, observing how the variations of the part differ from the part in association with the variations of the at least some of the tooling specifications and predicting how the tooling will react to future instructions to build a new part and to variations in the future instructions in accordance with results of the observing.

In accordance with additional or alternative embodiments, the computerized specifications include at least one of computer aided design (CAD) specifications and computer aided manufacturing (CAM) specifications.

In accordance with additional or alternative embodiments, the tooling specifications include models of machine tools, controllers, stock designs, cutters and tool paths.

In accordance with additional or alternative embodiments, the tooling specifications further include machine capability information.

In accordance with additional or alternative embodiments, the machine capability information includes axis position accuracy information.

In accordance with additional or alternative embodiments, the machine capability information includes cutter accuracy information.

In accordance with additional or alternative embodiments, the variations of the tooling specifications include changes to axis position accuracy information and cutter accuracy information.

In accordance with additional or alternative embodiments, the observing includes measuring dimensional differences between the variations of the part and the part.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE DRAWINGS

For a more complete understanding of this disclosure, reference is now made to the following brief description, taken in connection with the accompanying drawings and detailed description, wherein like reference numerals represent like parts:

FIG. 2 is a flow diagram illustrating a method of predicting machined part variations for design optimization in accordance with embodiments;

DETAILED DESCRIPTION

Figure 1:
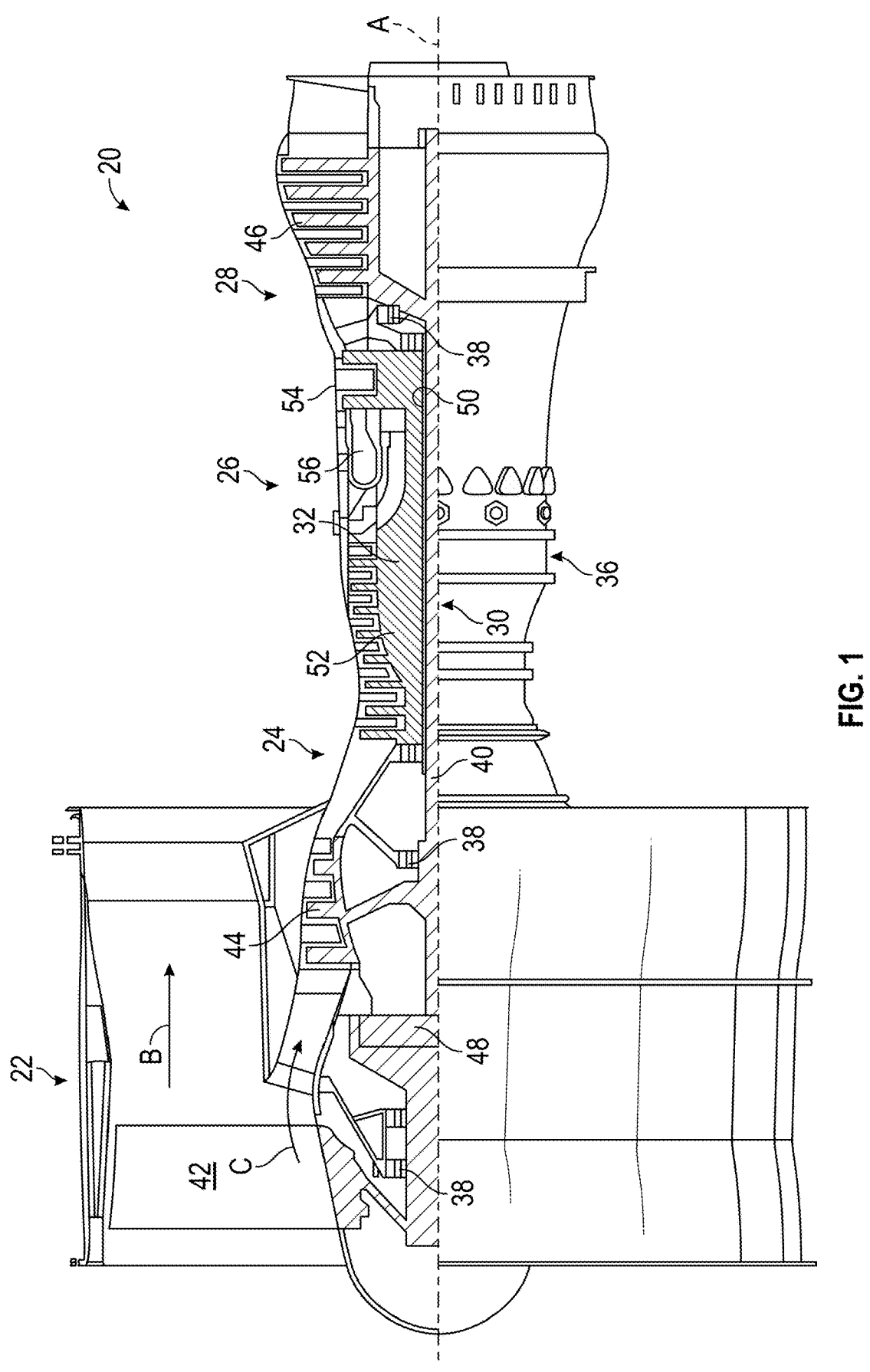
FIG. 1 is a partial cross-sectional view of a gas turbine engine in accordance with embodiments.

FIG. 1 schematically illustrates a gas turbine engine 20. The gas turbine engine 20 is disclosed herein as a two-spool turbofan that generally incorporates a fan section 22, a compressor section 24, a combustor section 26 and a turbine section 28. Alternative engines might include other systems or features. The fan section 22 drives air along a bypass flow path B in a bypass duct, while the compressor section 24 drives air along a core flow path C for compression and communication into the combustor section 26 then expansion through the turbine section 28. Although depicted as a two-spool turbofan gas turbine engine in the disclosed non-limiting embodiment, it should be understood that the concepts described herein are not limited to use with two-spool turbofans as the teachings may be applied to other types of turbine engines including three-spool architectures.

The exemplary engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided, and the location of bearing systems 38 may be varied as appropriate to the application.

The low speed spool 30 generally includes an inner shaft 40 that interconnects a fan 42, a low pressure compressor 44 and a low pressure turbine 46. The inner shaft 40 is connected to the fan 42 through a speed change mechanism, which in exemplary gas turbine engine 20 is illustrated as a geared architecture 48 to drive the fan 42 at a lower speed than the low speed spool 30. The high speed spool 32 includes an outer shaft 50 that interconnects a high pressure compressor 52 and high pressure turbine 54. A combustor 56 is arranged in exemplary gas turbine 20 between the high pressure compressor 52 and the high pressure turbine 54. An engine static structure 36 is arranged generally between the high pressure turbine 54 and the low pressure turbine 46. The engine static structure 36 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. The turbines 46, 54 rotationally drive the respective low speed spool 30 and high speed spool 32 in response to the expansion. It will be appreciated that each of the positions of the fan section 22, compressor section 24, combustor section 26, turbine section 28, and fan drive gear system 48 may be varied. For example, gear system 48 may be located aft of combustor section 26 or even aft of turbine section 28, and fan section 22 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), the geared architecture 48 is an epicyclic gear train, such as a planetary gear system or other gear system, with a gear reduction ratio of greater than about 2.3 and the low pressure turbine 46 has a pressure ratio that is greater than about five. In one disclosed embodiment, the engine 20 bypass ratio is greater than about ten (10:1), the fan diameter is significantly larger than that of the low pressure compressor 44, and the low pressure turbine 46 has a pressure ratio that is greater than about five 5:1. Low pressure turbine 46 pressure ratio is pressure measured prior to inlet of low pressure turbine 46 as related to the pressure at the outlet of the low pressure turbine 46 prior to an exhaust nozzle. The geared architecture 48 may be an epicycle gear train, such as a planetary gear system or other gear system, with a gear reduction ratio of greater than about 2.3:1. It should be understood, however, that the above parameters are only exemplary of one embodiment of a geared architecture engine and that the present disclosure is applicable to other gas turbine engines including direct drive turbofans.

As will be described below, a method of predicting part variations using virtual machining is provided for use with parts, such as those included in the engine 20 of FIG. 1, although it is to be understood that the parts can be from any other assembly or system. An as-built part will be produced using virtual machining with processes that include models of a machine tool, a controller, a stock design, a cutter and tool paths. All these elements can have variations. For example, a capability of the machine will be described by an accuracy of the machine, such as axis position accuracy based on machine tool calibration data or machine specifications. The variations of the cutter will be represented by its accuracy. The variations of the stock design will be described by its accuracy or tolerance. A number of as-built parts with variations can then be produced by introducing machine/cutter/stock variations into the virtual machining. The virtual machining can also incorporate other process variations such as tool/part deflections by including cutting force models.

Figure 3:
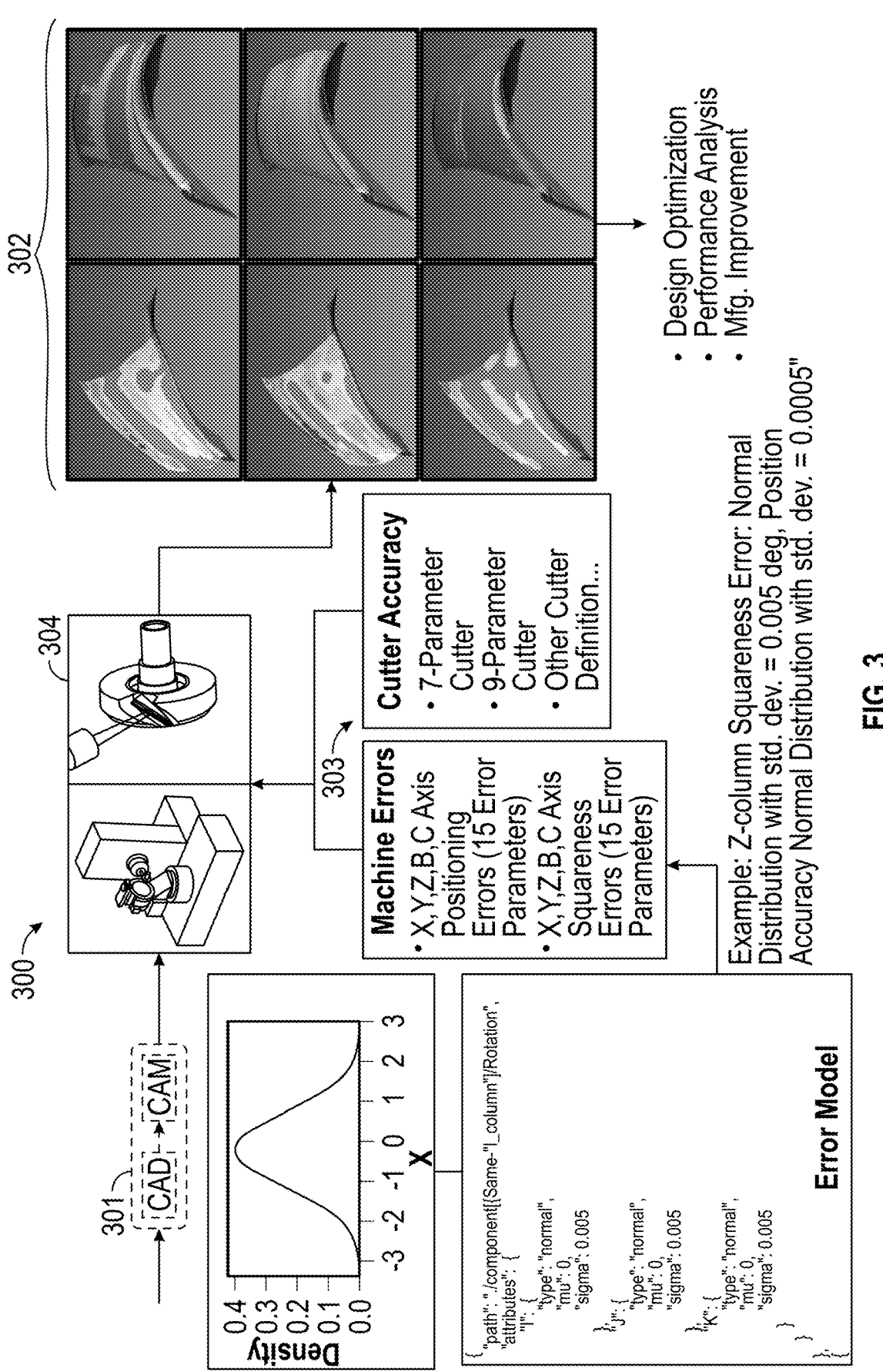
FIG. 3 is a flow diagram illustrating a system for executing the method of FIG. 2 in accordance with embodiments.

With reference to FIGS. 2 and 3, a method 200 (see FIG. 2) of predicting machined part variations for design optimization is provided for execution by a system 300 (see FIG. 3).

The method includes receiving computerized specifications 301 for a part (201) and receiving tooling specifications for tooling used for building the part (202). The computerized specifications 301 can include at least one of computer aided design (CAD) specifications and computer aided manufacturing (CAM) specifications. The tooling specifications can include models of machine tools, controllers, stock designs, cutters and tool paths. The tooling specifications can further include machine capability information. In accordance with embodiments, the machine capability information can include axis position accuracy information and/or cutter accuracy information. The method further includes producing the part using virtual machining as illustrated by the output 302 in FIG. 2 based on the computerized and the tooling specifications (203).

At this point, the method includes varying at least some of the tooling specifications by introducing errors 303 for example (204) and producing variations of the part using the virtual machining based on the computerized specifications and the tooling specifications and based on variations of the at least some of the tooling specifications (205). The variations of the tooling specifications can include changes to axis position accuracy information and cutter accuracy information. Next, the method includes observing how the variations of the part differ from the part in association with the variations of the at least some of the tooling specifications (206) and predicting how the tooling will react to future instructions to build a new part and to variations in the future instructions in accordance with results of the observing (207). The observing of operation 206 can include measuring dimensional differences between the variations of the part and the part.

Commercial software packages such as NX, CATIA, Creo, Solidworks, etc. can be used for part design and manufacturing process planning and development. The main output from the Computer Aided Manufacturing (CAM) will be the CNC tool path, or G-code, as generally called in the industry. In actual production, the developed G-code will be loaded to the machine controller and used to command the tool motion path to machining the part. The virtual machining (304) can be developed by using software tools such as VeriCut or NX ISV. The virtual machining (304) will include a model for the machine tool which describes the geometric configuration and the kinematics of the actual machine tool, model of the fixtures used to hold and manipulate the workpiece during the machining, a model of the spindle which holds and rotates the various cutters used for the machining, and a model of the cutters which describe the geometry of the cutters, and a model of the stock from which the finished workpiece will be generated.

With the nominal setup, cutter dimensions, stock geometry and fixtures, the virtual machining should produce a part with the nominal geometry. With various errors injected into the virtual machining, the geometry of the produced part will deviate from its nominal (302). The various color in the picture (302) represents the amount of deviation from its nominal. The interested dimensions on the part can be measured to obtain the actual dimension variations.

For a complete assessment of the potential variation of the manufactured part, virtual DOE can be performed using the virtual machining to produce a number of parts. The distribution of the part variation for any dimensions or design features can be obtained. This data can be further analyzed to obtain the process capability such as Cpk. Regression analysis of the measured dimension variations and the input variations can be used to find which parameters have the dominant influence on the variations.

The amount of variation depends on the capability (accuracy) of the machine tool (the variations of the axis positions, cutting tool dimensions etc.), and the part design (the geometry of the part). The obtained variation can be feedback to the design for performance analyses such as air aero calculations and stress analysis of the structure. The analysis will generate variation of the performance. If the performance does not satisfy the design requirement, design can be modified, and the above virtual machining assessment can be repeated.

This can also be used in other way. If the designer has already chosen the needed variation range for a particular dimension (the tolerance for the dimension), the virtual machining can be used to assess if the current manufacturing equipment/technology can achieve the required tolerances. If not, new manufacturing method/technology needs to be developed to meet the requirement.

Another way to use this invention is to evaluate machining options and cost. If there are multiple machines or suppliers to choose from, this method can be used to evaluate the machining options to see if a lower-cost machine can achieve the required tolerances.

The virtual machining (304) can also include physics-based machining models to predict deflections of the machines, spindles, the cutting tools, and the part being machined as well as machining process dynamic models to predict vibration and chatter which can also alter the geometry of the machined parts.

Figure 4:
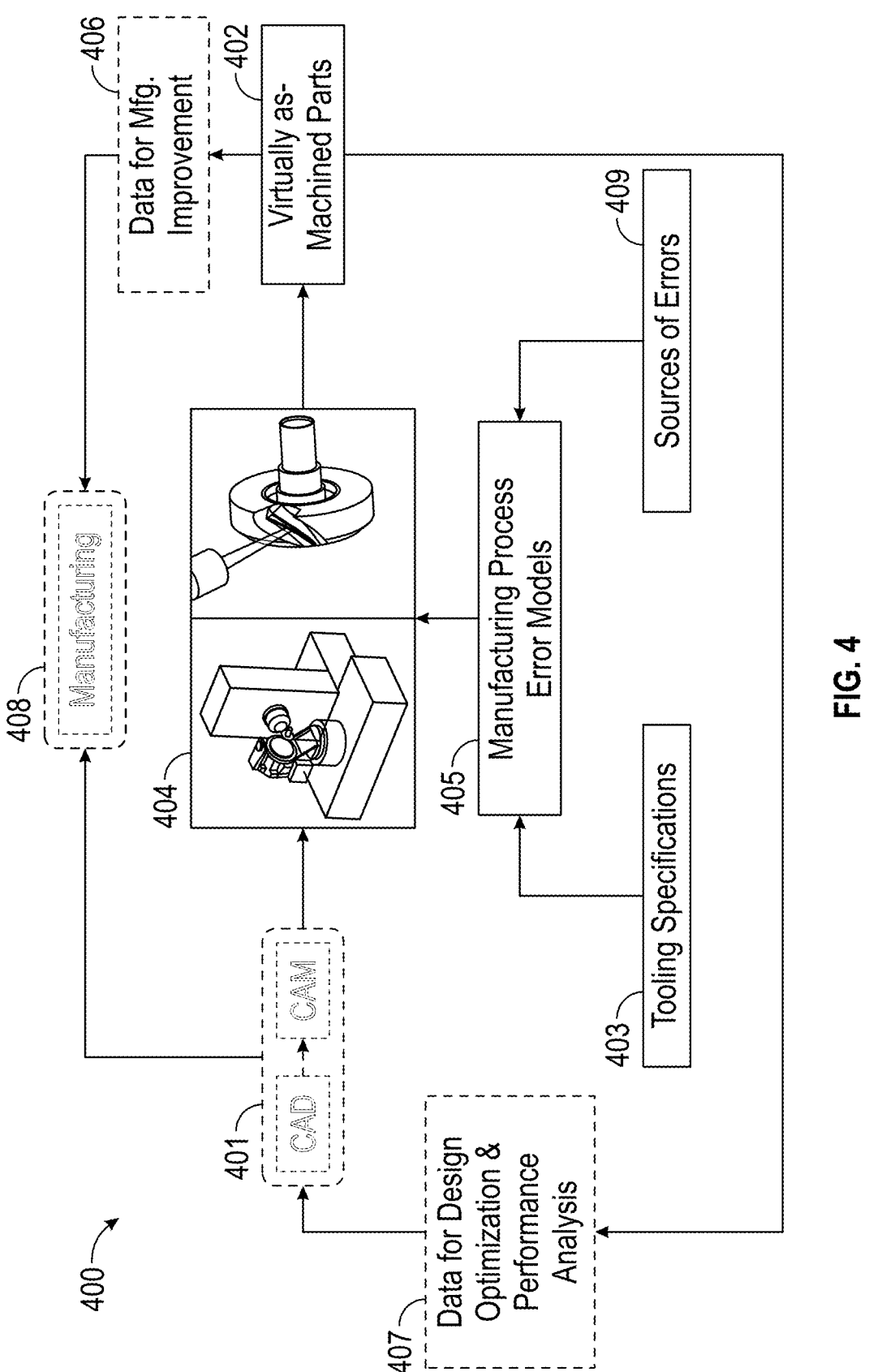
FIG. 4 is a flow diagram illustrating a system for executing the method of FIG. 2 in accordance with alternative embodiments.

With reference to FIG. 4, an alternative system 400 is provided to execute the method 200 of FIG. 2 in a similar manner as the system 300 of FIG. 3 or to execute other similar methods. As shown in FIG. 4, a CAD/CAM model 401 is generated and rendered by a computing system 404. The computing system 404 is receptive of manufacturing process error models 405, which are produced from tooling specifications 403 and information reflective of sources of errors 409. The computing system 404 then generates an output of virtually, as-machined parts 402. Data for design optimization and performance analysis 407 is then generated from the output and fed back into the CAD/CAM model 401. Data for manufacturing improvement 406 is also generated from the output and fed into the manufacturing components 408 along with the CAD/CAM model 401. The manufacturing components 408 thus manufacture the parts represented by the CAD/CAM model 401 as generally described above.

Although not shown in FIG. 4, additional or alternative embodiments for the system 400 (and the system 300) exist. These include, but are not limited to, embodiments in which the data for manufacturing improvement 406 are input into the tooling specifications 403 and the information reflective of sources of errors 409, an additional loop from the manufacturing components to the data for manufacturing improvement 406 and the data for design optimization and performance analysis 407 to account for cases where a manufactured part diverges from its design for some (at least initially unknown reason) and an additional decision point between the CAD/CAM model 401 and the manufacturing components 408 which requires the CAD/CAM model 401 to be updated a certain number of times in order to insure that the CAD/CAM model 401 is optimized and debugged to a reasonable extent.

Technical effects and benefits of the present disclosure are the provision of an optimized design incorporating manufacturing/machine capabilities, a design with better manufacturability and reduced costs for manufacturing process development. Another benefit of the present disclosure is as the provision of a tool to find root causes of part variation(s) in production and to make improvements in the production manufacturing processes. The method will enable engineers to quickly find out which process variations lead to part variations. Virtual Design of Experiment or Monte Carlo simulations can be used.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A method of predicting machined part variations for design optimization, the method comprising:
    receiving computerized specifications for a part and tooling specifications for tooling used for building the part;
    producing the part using virtual machining, by a computing system, based on the computerized and the tooling specifications; and
    producing variations of the part using the virtual machining, by the computing system, based on the computerized and the tooling specifications and based on variations of at least some of the tooling specifications, wherein:

the computing system is configured to generate computer aided design (CAD)/computer aided manufacturing (CAM) models for the virtual machining, is receptive of manufacturing process error models produced from the tooling specifications and information reflective of sources of errors derived from differences between the part and the variations of the part and is configured to generate an output of virtually, as-machined parts, and the method further comprises:

generating data for manufacturing improvement and data for design optimization and performance analysis from the output;

generating updated CAD/CAM models based on the data for design optimization and performance analysis from the output;

feeding the data for manufacturing improvement and the updated CAD/CAM models into manufacturing components; and manufacturing the part by the manufacturing components in accordance with the data for manufacturing improvement and the updated CAD/CAM models.

2. The method according to claim 1, wherein the computerized specifications comprise CAD specifications and CAM specifications.

3. The method according to claim 1, wherein the tooling specifications comprise models of machine tools, controllers, stock designs, cutters and tool paths.

4. The method according to claim 3, wherein the tooling specifications further comprise machine capability information.

5. The method according to claim 4, wherein the machine capability information comprises axis position accuracy information.

6. The method according to claim 4, wherein the machine capability information comprises cutter accuracy information.

7. The method according to claim 1, wherein the variations of the tooling specifications comprise changes to axis position accuracy information and cutter accuracy information.

8. A method of predicting machined part variations for design optimization, the method comprising:

receiving computerized specifications for a part and tooling specifications for tooling used for building the part;

producing the part using virtual machining, by a computing system, based on the computerized and the tooling specifications;

varying at least some of the tooling specifications;

producing variations of the part using the virtual machining, by the computing system, based on the computerized and the tooling specifications and based on variations of the at least some of the tooling specifications;

observing how the variations of the part differ from the part in association with the variations of the at least some of the tooling specifications;

predicting how the tooling will react to future instructions to build a new part and to variations in the future instructions in accordance with results of the observing, wherein:

the computing system is configured to generate computer aided design (CAD)/computer aided manufacturing (CAM) models for the virtual machining, is receptive of manufacturing process error models produced from the tooling specifications and information reflective of sources of errors derived from results of the observing and the predicting, and is configured to generate an output of virtually, as-machined parts, and the method further comprises:

generating data for manufacturing improvement and data for design optimization and performance analysis from the output;

generating updated CAD/CAM models based on the data for design optimization and performance analysis from the output;

feeding the data for manufacturing improvement and the updated CAD/CAM models into manufacturing components; and manufacturing the part by the manufacturing components in accordance with the data for manufacturing improvement and the updated CAD/CAM models.

9. The method according to claim 8, wherein the computerized specifications comprise CAD specifications and CAM specifications.

10. The method according to claim 8, wherein the tooling specifications comprise models of machine tools, controllers, stock designs, cutters and tool paths.

11. The method according to claim 10, wherein the tooling specifications further comprise machine capability information.

12. The method according to claim 11, wherein the machine capability information comprises axis position accuracy information.

13. The method according to claim 11, wherein the machine capability information comprises cutter accuracy information.

14. The method according to claim 8, wherein the variations of the tooling specifications comprise changes to axis position accuracy information and cutter accuracy information.

15. The method according to claim 8, wherein the observing comprises measuring dimensional differences between the variations of the part and the part.

* * * * *